United States Patent [19]
Jang et al.

[11] Patent Number: 6,090,714
[45] Date of Patent: Jul. 18, 2000

[54] CHEMICAL MECHANICAL POLISH (CMP) PLANARIZING TRENCH FILL METHOD EMPLOYING COMPOSITE TRENCH FILL LAYER

[75] Inventors: Syun-Ming Jang, Hsin-Chu; Chu-Yun Fu, Taipei, both of Taiwan

[73] Assignee: Taiwan Semiconductor Manufacturing Company, Hsin-Chu, Taiwan

[21] Appl. No.: 09/177,189

[22] Filed: Oct. 23, 1998

[51] Int. Cl.⁷ .................................................. H01L 21/302
[52] U.S. Cl. .......................... 438/692; 438/693; 438/697; 438/710
[58] Field of Search ...................................... 438/692, 710

[56] References Cited

U.S. PATENT DOCUMENTS

| | | | |
|---|---|---|---|
| 5,094,972 | 3/1992 | Pierce et al. | 437/67 |
| 5,182,221 | 1/1993 | Sato | 437/67 |
| 5,665,635 | 9/1997 | Kwon et al. | 438/427 |
| 5,702,977 | 12/1997 | Jang et al. | 437/67 |
| 5,817,567 | 10/1998 | Jang et al. | 438/427 |

OTHER PUBLICATIONS

M.H. Park, "Stress Minimization in Deep Sub–Micron Full CMOS Devices by Using an Optimized Combination of the Trench Filling CVD Oxides", IEDM 97.

*Primary Examiner*—Benjamin L. Utech
*Assistant Examiner*—Charlotte A. Brown
*Attorney, Agent, or Firm*—George O. Saile; Stephen B. Ackerman; Alek P. Szecsy

[57] ABSTRACT

A method for forming a planarized trench fill layer within a trench within a substrate. There is first provided a substrate having a trench formed therein. There is then formed over the substrate and at least partially filling the trench a first trench fill layer formed employing a high density plasma chemical vapor deposition (HDP-CVD) method. There is then formed upon the first trench fill layer a second trench fill layer formed employing a subatmospheric pressure thermal chemical vapor deposition (SACVD) method employing ozone as an oxidant source material and tetraethylorthosilicate (TEOS) as a silicon source material. Finally, there is then planarized by employing a chemical mechanical polish (CMP) planarizing method the second trench fill layer and the first trench fill layer to form a patterned planarized trench fill layer within the trench. When employing the method, the first trench fill layer is formed to a first thickness and the second trench fill layer is formed to a second thickness, where the first thickness and the second thickness are chosen such that there is attenuated erosion of the substrate when forming the patterned planarized trench fill layer within the trench while employing the chemical mechanical polish (CMP) planarizing method. The method is particularly useful for forming patterned planarized trench fill dielectric layers within isolation trenches within semiconductor substrates employed within semiconductor integrated circuit microelectronics fabrications.

6 Claims, 2 Drawing Sheets

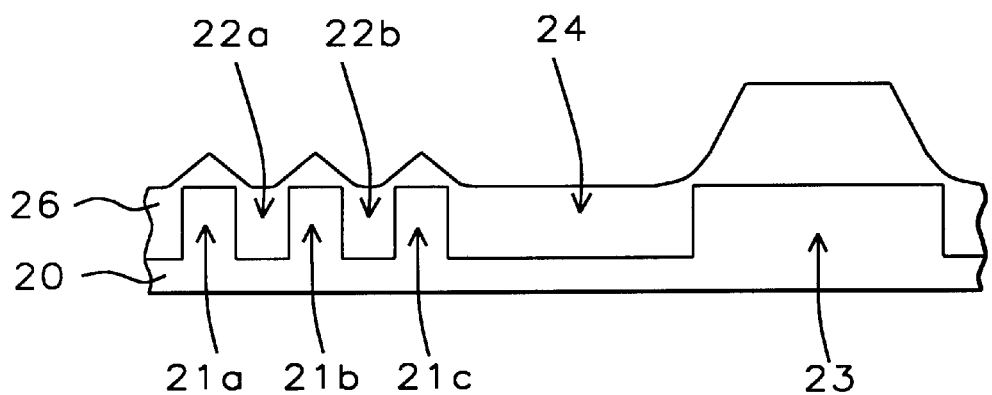
FIG. 1 – Prior Art
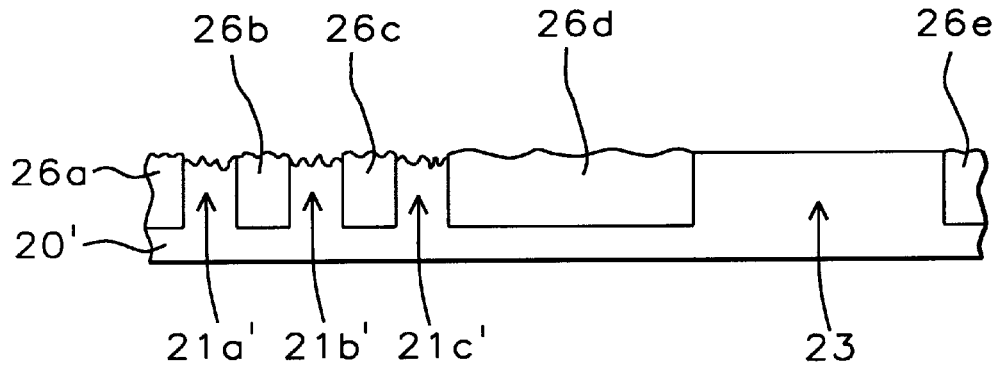
FIG. 2 – Prior Art
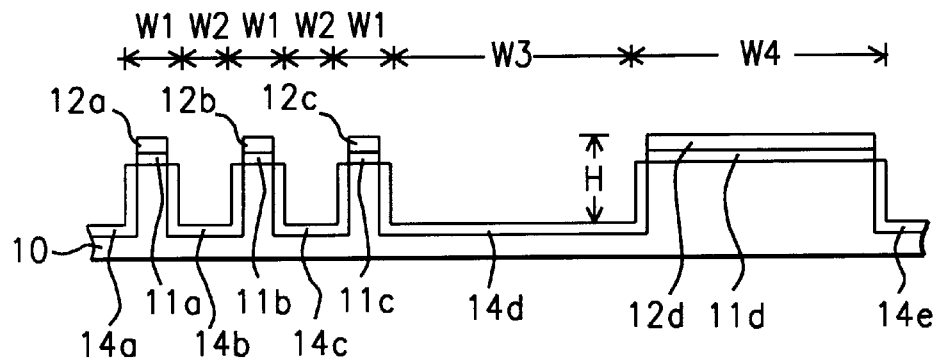
FIG. 3

CHEMICAL MECHANICAL POLISH (CMP) PLANARIZING TRENCH FILL METHOD EMPLOYING COMPOSITE TRENCH FILL LAYER

BACKGROUND OF THE INVENTION

1. Field of the Invention

The present invention relates generally to methods for forming trench fill layers within trenches within substrates employed within microelectronics fabrications. More particularly, the present invention relates to methods for forming with attenuated substrate surface erosion chemical mechanical polish (CMP) planarized trench fill layers within trenches within substrates employed within microelectronics fabrications.

2. Description of the Related Art

Semiconductor integrated circuit microelectronics fabrications are formed from semiconductor substrates within and upon which are formed integrated circuit devices. The integrated circuit devices are connected internally and externally to the semiconductor substrates upon which they are formed while employing patterned integrated circuit conductor layers which are separated by integrated circuit dielectric layers.

As integrated circuit microelectronics fabrication integration levels have increased and integrated circuit device and patterned conductor layer dimensions have decreased, it has become more prevalent within the art of integrated circuit microelectronics fabrication to employ trench isolation methods, such as but not limited to shallow trench isolation (STI) methods and recessed oxide isolation (ROI) methods, to form trench isolation regions within a semiconductor substrate in order to separate active regions of the semiconductor substrate within and upon which are formed integrated circuit devices.

Such shallow trench isolation (STI) methods and recessed oxide isolation (ROI) methods are desirable within integrated circuit microelectronics fabrications since shallow trench isolation (STI) methods and recessed oxide isolation (ROI) methods provide trench isolation regions which are nominally co-planar with a surface of an adjoining active region of a semiconductor substrate. Such nominally co-planar trench isolation regions and adjoining active regions of a semiconductor substrate generally optimize an attenuated depth of focus typically achievable with an advanced photoexposure apparatus employed when forming advanced integrated circuit microelectronics devices and advanced patterned conductor layers within an advanced integrated circuit microelectronics fabrication.

While shallow trench isolation (STI) methods and recessed oxide isolation (ROI) methods are thus desirable when forming trench isolation regions within advanced integrated circuit microelectronics fabrications, shallow trench isolation (STI) methods and recessed oxide isolation (ROI) methods are nonetheless not formed entirely without problems within advanced integrated circuit microelectronics fabrications. In particular, it is often difficult to form when employing shallow trench isolation (STI) methods within integrated circuit microelectronics fabrications shallow trench isolation (STI) regions which simultaneously possess superior gap filling properties, superior bulk physical properties and enhanced deposition rates which in the aggregate provide shallow trench isolation regions with optimal properties within advanced integrated circuit microelectronics fabrications.

Of the dielectric layer deposition methods potentially applicable for forming shallow trench isolation regions when employing shallow trench isolation (STI) methods within integrated circuit microelectronics fabrications, atmospheric pressure thermal chemical vapor deposition (APCVD) methods and sub-atmospheric pressure thermal chemical vapor deposition (SACVD) methods employing ozone as an oxidant source material and tetraethylorthosilicate (TEOS) as a silicon source material (hereinafter, in general, "ozone-TEOS thermal chemical vapor deposition (CVD) methods") are particularly desirable due to the superior gap filling properties of shallow trench isolation regions formed employing those ozone-TEOS thermal chemical vapor deposition (CVD) methods. Such ozone-TEOS thermal chemical vapor deposition (CVD) methods typically preclude plasma activation due to the increased reactor chamber pressures at which they are undertaken. While ozone-TEOS thermal chemical vapor deposition (CVD) methods do typically provide shallow trench isolation regions formed with superior gap filling properties, ozone-TEOS thermal chemical vapor deposition (CVD) methods typically nonetheless also typically provide shallow trench isolation regions with inferior bulk properties (as typically evidenced by increased aqueous hydrofluoric acid etch rate) and with attenuated deposition rates upon thermal silicon oxide trench liner layers formed employing thermal oxidation of silicon semiconductor substrates within which are formed those shallow trench isolation regions employing those ozone-TEOS thermal chemical vapor deposition (CVD) methods.

As an alternate dielectric layer deposition method which may be employed for forming shallow trench isolation regions when employing shallow trench isolation (STI) methods within semiconductor integrated circuit microelectronics fabrications, high density plasma chemical vapor deposition (HDP-CVD) methods have also recently received considerable attention. High density plasma chemical vapor deposition (HDP-CVD) methods are known as simultaneous sputter and chemical vapor deposition (CVD) methods and they are generally characterized by simultaneously employing a bias sputtering and chemical vapor deposition (CVD) of a trench fill dielectric layer when forming the trench fill dielectric layer into an isolation trench. The high density plasma chemical vapor deposited (HDP-CVD) trench fill dielectric layer is typically subsequently chemical mechanical polish (CMP) planarized to form a patterned planarized shallow trench isolation region within the shallow isolation trench.

While, similarly with ozone-TEOS thermal chemical vapor deposition (CVD) methods, high density plasma chemical vapor deposition (HDP-CVD) methods also form shallow trench isolation regions with enhanced gap filling properties, high density plasma chemical vapor deposition (HDP-CVD) methods also advantageously form shallow trench isolation regions with enhanced physical properties and with increased deposition rates upon thermal silicon oxide layers formed through thermal oxidation of silicon substrate layers. Unfortunately, when forming a patterned planarized shallow trench isolation region employing a chemical mechanical polish (CMP) planarizing of a blanket trench fill dielectric layer formed employing a high density plasma chemical vapor deposition (HDP-CVD) method there is often observed damage to a substrate within which is formed the chemical mechanical polish (CMP) patterned planarized shallow trench isolation region. A pair of schematic cross-sectional diagrams illustrating such substrate damage is shown in FIG. 1 and FIG. 2.

Shown in FIG. 1 is a substrate 20 having formed therein a series of comparatively narrow mesas 21a, 21b and 21c having interposed therebetween a pair of comparatively narrow trenches 22a and 22b, where the series of narrow mesas 21a, 21b and 21c is separated from a comparatively wide mesa 23 by a comparatively wide trench 24. Formed upon the substrate 20 and filling at least the pair of narrow trenches 22a and 22b and the wide trench 24 is a blanket trench fill layer 26 formed employing a high density plasma chemical vapor deposition (HDPCVD) method. As is characteristic for blanket trench fill layers formed employing high density plasma chemical vapor deposition (HDP-CVD) methods, the blanket trench fill layer 26 may be formed to planarize each of the pair of narrow trenches 22a and 22b, along with the wide trench 24, while simultaneously being formed to a greater thickness upon the wide mesa 23 than upon each narrow mesa within the series of the narrow mesas 21a, 21b and 21c.

Referring now to FIG. 2, there is shown a schematic cross-sectional diagram illustrating the results of further processing of the microelectronics fabrication whose schematic cross-sectional diagram is illustrated in FIG. 1. Shown in FIG. 2 is a schematic cross-sectional diagram of a microelectronics fabrication otherwise equivalent to the microelectronics fabrication whose schematic cross-sectional diagram is illustrated in FIG. 1, but wherein the blanket trench fill layer 26 has been chemical mechanical polish (CMP) planarized to form the patterned planarized trench fill layers 26a, 26b, 26c, 26d and 26e, while employing a chemical mechanical polish (CMP) planarizing method as is conventional in the art of microelectronics fabrication. As is illustrated within the schematic cross-sectional diagram of FIG. 2, upon chemical mechanical polish (CMP) planarizing of the blanket trench fill layer 26 to form the patterned planarized trench fill layers 26a, 26b, 26c, 26d and 26e, the narrow mesas 21a, 21b and 21b, but typically not the wide mesa 23, sustain damage as evidenced by erosion in forming the eroded narrow mesas 21a', 21b' and 21c'.

Damaged mesas, such as the eroded narrow mesas 21a', 21b' and 21c', are undesirable within the art of microelectronics fabrication, since it is often difficult to form either fully functional or fully reliable integrated circuit devices or integrated circuits when employing those damaged mesas.

It is thus towards the goal of forming within isolation trenches within semiconductor substrates within semiconductor integrated circuit microelectronics fabrications chemical mechanical polish (CMP) planarized trench isolation regions formed employing high density plasma chemical vapor deposition (HDP-CVD) methods, while simultaneously avoiding semiconductor substrate damage, that the present invention is more specifically directed. In a more general sense, the present invention is also directed towards forming within trenches within substrates employed within microelectronics fabrications which are not necessarily semiconductor integrated circuit microelectronics fabrications chemical mechanical polish (CMP) planarized trench fill layers formed employing high density plasma chemical vapor deposition (HDP-CVD) methods, while simultaneously avoiding substrate damage, that the present invention is more generally directed.

Various methods for forming trench isolation regions for use within isolation trenches within semiconductor substrates within semiconductor integrated circuit microelectronics fabrications have been disclosed within the art of semiconductor integrated circuit microelectronics fabrication.

For example, Pierce et al., in U.S. Pat. No. 5,094,972, disclose a chemical mechanical polish (CMP) planarizing method employing a planarizing stop layer for forming an isolation region within an isolation trench within a semiconductor substrate within a semiconductor integrated circuit microelectronics fabrication. The method may be employed for forming is isolation regions of width as wide as about one millimeter.

In addition, Sato, in U.S. Pat. No. 5,182,221, discloses a bias electron cyclotron resonance chemical vapor deposition (ECR-CVD) method for forming within a microelectronics fabrication a flat and void free isolation region. The method forms the isolation region while employing a vertical:horizontal deposition rate ratio which is equal to two times the depth of an isolation trench to be filled with the isolation region divided by the width of the isolation trench to be filled with the isolation region.

Further, Kwon et al., in U.S. Pat. No. 5,665,635, disclose a method for forming within a semiconductor integrated circuit microelectronics fabrication narrow isolation regions within narrow trenches simultaneously with wide isolation regions within wide trenches while forming the narrow isolation regions and wide isolation regions with enhanced planarity. The method employs a surface treatment of the semiconductor integrated circuit microelectronics fabrication in a fashion such that a dielectric material from which is formed the narrow isolation regions and the wide isolation regions is deposited more rapidly within the narrow trenches and wide trenches than upon areas adjoining the narrow trenches and wide trenches.

Yet further, Jang et al., in U.S. Pat. No. 5,702,977, disclose a method for forming a trench fill layer, such as an isolation region, within a shallow trench, such as an isolation trench, within a semiconductor integrated circuit microelectronics fabrication. Analogously with Kwon et alt. the method employs forming within the shallow trench an integrated circuit layer upon which may be deposited a blanket trench fill layer with a higher growth rate than upon portions of the semiconductor integrated circuit substrate other than those within the trench, but wherein the blanket trench fill layer so formed is formed to a thickness such that when chemical mechanical polish (CMP) planarized there is avoided formation of a dish within a planarized trench fill layer formed within the trench.

Finally, Park et al., in "Stress Minimization in Deep Sub-Micron Full CMOS Devices by Using an Optimized Combination of the Trench Filling CVD Oxides," IEDM 97, IEEE (1997), pp. 669–72, disclose a stress attenuated shallow trench isolation region and method for fabrication thereof for use within a semiconductor integrated circuit microelectronics fabrication. The method employs a first silicon oxide layer formed into an isolation trench employing an ozone-TEOS thermal chemical vapor deposition (CVD) method and a second silicon oxide layer formed thereupon employing a plasma enhanced chemical vapor deposition (PECVD) method.

Desirable in the art of microelectronics fabrication are methods for forming within trenches within substrates employed within microelectronics fabrications which are not necessarily semiconductor integrated circuit microelectronics fabrications chemical mechanical polish (CMP) planarized trench fill layers formed employing high density plasma chemical vapor deposition (HDP-CVD) methods, while simultaneously attenuating substrate damage. More particularly desirable in the art of microelectronics fabrication are methods for forming within isolation trenches within semiconductor substrates within semiconductor integrated circuit microelectronics fabrications chemical mechanical polish (CMP) planarized trench isolation regions formed employing high density plasma chemical vapor deposition (HDP-CVD) methods, while simultaneously attenuating semiconductor substrate damage.

It is towards the foregoing objects that the present invention is both generally and more specifically directed.

SUMMARY OF THE INVENTION

A first object of the present invention is to provide a method for forming within a trench within a substrate employed within a microelectronics fabrication a chemical mechanical polish (CMP) planarized trench fill layer.

A second object of the present invention is to provide a method in accord with the first object of the present invention, where the chemical mechanical polish (CMP) planarized trench fill layer is formed employing a high density plasma chemical vapor deposition (HDPCVD) method while forming the chemical mechanical polish (CMP) planarized trench fill layer with attenuated substrate damage.

A third object of the present invention is to provide a method in accord with the first object of the present invention or the second object of the present invention, where the substrate is a semiconductor substrate employed within a semiconductor integrated circuit microelectronics fabrication and the planarized trench fill layer is an isolation region formed within an isolation trench within the semiconductor substrate.

A fourth object of the present invention is to provide a method in accord with the first object of the present invention, the second object of the present invention or the third object of the present invention, which method is readily commercially implemented.

In accord with the objects of the present invention, there is provided a method for forming a planarized trench fill layer within a trench within a substrate employed within a microelectronics fabrication. To practice the method of the present invention, there is first provided a substrate having a trench formed therein. There is then formed over the substrate and at least partially filling the trench a blanket first trench fill layer formed employing a high density plasma chemical vapor deposition (HDP-CVD) method. There is then formed upon the blanket first trench fill layer a blanket second trench fill layer formed employing a subatmospheric pressure thermal chemical vapor deposition (SACVD) method employing ozone as an oxidant source material and tetraethylorthosilicate (TEOS) as a silicon source material. Finally, there is then planarized while employing a chemical mechanical polish (CMP) planarizing method the blanket second trench fill layer and the blanket first trench fill layer to form a patterned planarized trench fill layer within the trench.

Within the method of the present invention, the blanket first trench fill layer is formed to a first thickness and the blanket second trench fill layer is formed to a second thickness, where the first thickness and the second thickness are chosen such that there is attenuated erosion of the substrate when forming the patterned planarized trench fill layer within the trench while employing the chemical mechanical polish (CMP) planarizing method.

The present invention provides a method for forming within a trench within a substrate employed within a microelectronics fabrication a chemical mechanical polish (CMP) planarized trench fill layer, where the chemical mechanical polish (CMP) planarized trench fill layer is formed employing a high density plasma chemical vapor deposition (HDP-CVD) method while forming the chemical mechanical polish (CMP) planarized trench fill layer with attenuated substrate damage. The method of the present invention realizes the foregoing object by employing when forming the planarized trench fill layer: (1) a blanket first trench fill layer formed employing a high density plasma chemical vapor deposition (HDP-CVD) method, where the blanket first trench fill layer has formed thereupon a blanket second trench fill layer formed employing a subatmospheric pressure thermal chemical vapor deposition (SACVD) method employing ozone as an oxidant source material and tetraethylorthosilicate (TEOS) as a silicon source material; and (2) the blanket first trench fill layer formed to a first thickness and the blanket second trench fill layer formed to a second thickness, where the first thickness and the second thickness are chosen such that there is attenuated erosion of the substrate when forming the patterned planarized trench fill layer within the trench while employing the chemical mechanical polish (CMP) planarizing method.

The method of the present invention may be employed where the substrate is a semiconductor substrate employed within a semiconductor integrated circuit microelectronics fabrication and where the planarized trench fill layer is an isolation region formed within an isolation trench within the semiconductor substrate. The method of the present invention does not discriminate with respect to the nature of a substrate within which is formed a trench fill layer in accord with the method of the present invention. Thus, although the method of the present invention provides particular value when forming a planarized trench fill dielectric layer as an isolation region within a trench within a semiconductor substrate employed within a semiconductor integrated circuit microelectronics fabrication, the method of the present invention may also be employed when forming trench fill layers including but not limited to trench fill conductor layers, trench fill semiconductor layers and trench fill dielectric layers within trenches within substrates employed within microelectronics fabrications including but not limited to semiconductor integrated circuit microelectronics fabrications, solar cell microelectronics fabrications, ceramic substrate microelectronics fabrications and flat panel display microelectronics fabrications.

The method of the present invention is readily commercially implemented. As is illustrated within the Description of the Preferred Embodiment which follows, the method of the present invention may be practiced employing methods and materials as are generally known in the art of microelectronics fabrication. Since it is a novel ordering of methods and materials which provides the method of the present invention rather than the existence of methods and materials which provides the method of the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein:

FIG. 1 and FIG. 2 show a pair of schematic cross-sectional diagrams illustrating substrate erosion when forming a chemical mechanical polish (CMP) planarized trench fill layer within a trench within a substrate employed within a microelectronics fabrication while employing a high density plasma chemical vapor deposition (HDP-CVD) method as is conventional in the art of microelectronics fabrication.

FIG. 3, FIG. 4, FIG. 5 and FIG. 6 show a series of schematic cross-sectional diagrams illustrating the results of forming within a semiconductor substrate employed within a semiconductor integrated circuit microelectronics fabrication a planarized trench fill dielectric layer employed as an isolation region within an isolation trench within the semiconductor substrate while employing the method of the present invention.

DESCRIPTION OF THE PREFERRED EMBODIMENT

Figure 4:
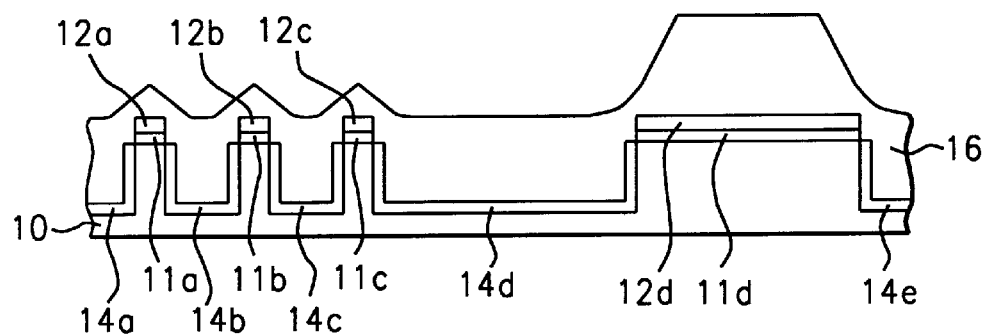

The present invention provides a method for forming within a trench within a substrate employed within a microelectronics fabrication a chemical mechanical polish (CMP) planarized trench fill layer, where the chemical mechanical polish (CMP) planarized trench fill layer is formed employing a high density plasma chemical vapor deposition (HDP-CVD) method while forming the chemical mechanical polish (CMP) planarized trench fill layer with attenuated substrate damage. The method of the present invention realizes the foregoing object by employing when forming the planarized trench fill layer: (1) a blanket first trench fill layer formed employing a high density plasma chemical vapor deposition (HDP-CVD) method, where the blanket first trench fill layer has formed thereupon a blanket second trench fill layer formed employing a subatmospheric pressure thermal chemical vapor deposition (SACVD) method employing ozone as an oxidant source material and tetraethylorthosilicate (TEOS) as a silicon source material; and (2) the blanket first trench fill layer formed to a first thickness and the blanket second trench fill layer formed to a second thickness, where the first thickness and the second thickness are chosen such that there is attenuated erosion of the substrate when forming the planarized trench fill layer within the trench while employing the chemical mechanical polish (CMP) planarizing method.

Although, as illustrated within the Preferred Embodiment of the Present Invention, the method of the present invention provides particular value when forming a planarized trench fill dielectric layer as an isolation region within an isolation trench within a semiconductor substrate employed within a semiconductor integrated circuit microelectronics fabrication, the method of the present invention may also be employed when forming trench fill layers including but not limited to trench fill conductor layers, trench fill semiconductor layers and trench fill dielectric layers within trenches within substrates employed within microelectronics fabrications including but not limited to semiconductor integrated circuit microelectronics fabrications, solar cell microelectronics fabrications, ceramic substrate microelectronics fabrications and flat panel display microelectronics fabrications. Under such circumstances it is required within the method of the present invention that the trench fill conductor layers, trench fill semiconductor layers and trench fill dielectric layers be formed as composite bilayer layers where a lower layer within the bilayer is formed employing a high density plasma chemical vapor deposition (HDP-CVD) method and an upper layer within the bilayer is formed employing a subatmospheric pressure thermal chemical vapor deposition (SACVD) method employing ozone as an oxidant source material and tetraethylorthosilicate (TEOS) as a silicon source material.

Referring now to FIG. 3 to FIG. 6, there is shown a series of schematic cross-sectional diagrams illustrating the results of progressive stages in forming within a semiconductor integrated circuit microelectronics fabrication in accord with a preferred embodiment of the present invention a series of chemical mechanical polish (CMP) planarized trench fill dielectric layers as isolation regions within a series of isolation trenches within a semiconductor substrate. Shown in FIG. 3 is a schematic cross-sectional diagram of the semiconductor integrated circuit microelectronics fabrication at an early stage in its fabrication.

Shown in FIG. 3 is a semiconductor substrate 10 employed within a semiconductor integrated circuit microelectronics fabrication, where the semiconductor substrate 10 has formed therein a series of narrow mesas of width W1 having interposed therebetween a pair of narrow trenches of width W2, where the series of narrow mesas of width W1 is separated from a wide mesa of width W4 by a wide trench of width W3. Although semiconductor substrates are known in the art with either dopant polarity, several dopant concentrations and various crystallographic orientations, for the preferred embodiment of the present invention, the semiconductor substrate 10 is preferably a (100) silicon semiconductor substrate having an N- or P- doping.

Within the preferred embodiment of the present invention as illustrated within the microelectronics fabrication whose schematic cross-sectional diagram is illustrated in FIG. 3, the width W1 of each of the narrow mesas is preferably from about 0.3 to about 0.5 microns, the width W2 of each of the narrow trenches is preferably from about 0.3 to about 0.5 microns, the width W3 of the wide trench is preferably from about 100 to about 1000 microns and the width W4 of the wide mesa is preferably from about 50 to about 100 microns. Similarly, as is also illustrated within the schematic cross-sectional diagram of FIG. 3, the depth H of each of the narrow trenches and the wide trench is preferably from about 4000 to about 6000 angstroms.

As is illustrated within the schematic cross-sectional diagram of FIG. 3, each of the mesas has formed thereupon a corresponding coextensive patterned pad oxide layer 11a, 11b, 11c or 11d in turn having formed thereupon a corresponding coextensive patterned silicon nitride layer 12a, 12b, 12c or 12d. As is understood by a person skilled in the art, each of the patterned pad oxide layers 11a, 11b, 11c or 11d is preferably formed employing a thermal oxidation method at a temperature of from about 800 to about 1000 degrees centigrade, where a portion of the semiconductor substrate 10 is consumed when forming the series of patterned pad oxide layers. Preferably, each of the patterned pad oxide layers 11a, 11b, 11c and 11d so formed is formed to a thickness of from about 100 to about 150 angstroms. Similarly, each of the patterned silicon nitride layers 12a, 12b, 12c and 12d is preferably formed employing a thermal nitridation method to form each of the patterned silicon nitride layers 12a, 12b, 12c and 12d of thickness about 800 to about 2000 angstroms.

As is understood by a person skilled in the art , the series of patterned silicon nitride layers 12a, 12b, 12c and 12d will subsequently serve as a polish stop layer when chemical polish planarizing a trench fill dielectric layer within the pair of narrow trenches and the wide trench within the integrated circuit microelectronics fabrication whose schematic cross-sectional diagram is illustrated in FIG. 3. Likewise, as is also understood by a person skilled in the art, the patterned pad oxide layers 11a, 11b, 11c and 11d serve as a series of stress reducing layers formed interposed between the patterned silicon nitride layers 12a, 12b, 12c and 12d, and the corresponding mesas within the semiconductor substrate 10 employed within the integrated circuit microelectronics fabrication whose schematic cross-sectional diagram is illustrated within FIG. 3.

Finally, there is shown within FIG. 3 a series of patterned thermal silicon oxide trench liner layers 14a, 14b, 14c, 14d and 14e formed within trenches including the pair of narrow trenches and the wide trench. The thermal silicon oxide trench liner layers 14a, 14b, 14c, 14d and 14e are formed employing methods and materials analogous or equivalent to the methods and materials employed when forming the patterned pad oxide layers 11a, 11b, 11c and 11d. Preferably, the thermal silicon oxide trench liner layers 14a, 14b, 14c, 14d and 14e are formed employing a thermal oxidation method at a temperature of from about 800 to about 1000 degrees centigrade to form each thermal silicon oxide trench liner layer 14a, 14b, 14c, 14d or 14e to a thickness of from about 150 to about 400 angstroms while consuming a portion of the semiconductor substrate 10.

As is understood by a person skilled in the art, the thermal silicon oxide trench liner layers 14a, 14b, 14c, 14d and 14e assist in providing optimal isolation of semiconductor integrated circuit devices formed upon the mesas within the semiconductor substrate 10. Similarly, as is also understood by a person skilled in the art, although the patterned pad oxide layers 11a, 11b, 11c and 11d, the patterned silicon nitride layers 12a, 12b, 12c and 12d and the patterned thermal silicon oxide trench liner layers 14a, 14b, 14c, 14d and 14e are all optional within a microelectronics fabrication formed in accord with the present invention, they are generally desirable and typically employed within the preferred embodiment of the present invention as illustrated within the integrated circuit microelectronics fabrication whose schematic cross-sectional diagram is illustrated in FIG. 3.

Referring now to FIG. 4, there is shown a schematic cross-sectional diagram illustrating the results of further processing of the integrated circuit microelectronics fabrication whose schematic cross-sectional diagram is illustrated in FIG. 3. Shown in FIG. 4 is a schematic cross-sectional diagram of an integrated circuit microelectronics fabrication otherwise equivalent to the integrated circuit microelectronics fabrication whose schematic cross-sectional diagram is illustrated in FIG. 3, but wherein there is formed upon the integrated circuit microelectronics fabrication and at least partially filling the pair of narrow trenches and the wide trench a blanket first trench fill dielectric layer 16 formed employing a high density plasma chemical vapor deposition (HDP-CVD) method. Although there may be formed employing high density plasma chemical vapor deposition (HDP-CVD) methods blanket trench fill dielectric layers of dielectric materials including but not limited to silicon oxide dielectric materials, silicon nitride dielectric materials and silicon oxynitride dielectric materials, for the preferred embodiment of the present invention, the blanket first trench fill dielectric layer 16 is preferably formed of a silicon oxide dielectric material formed employing silane as a silicon source material. A blanket trench fill dielectric layer formed employing such a method and material is typically formed with enhanced gap filling properties, enhanced bulk properties (as typically evidenced by dilute hydrofluoric acid etch rate) and an enhanced deposition rate even when formed upon a thermal silicon oxide substrate layer, such as the patterned thermal silicon oxide trench lin er layers 14a, 14b, 14c, 14d and 14e.

Preferably, the high density plasma chemical vapor deposition (HDP-CVD) method also employs: (1) a reactor chamber pressure of from about 10 to about 13 mtorr; (2) a top source radio frequency power of from about 1000 to about 1500 watts and a side source radio frequency power of from about 3000 to about 3500 watts; (3) a bias sputtering power of from about 1500 to about 3500 watts; (4) a semiconductor substrate 10 temperature of from about 500 to about 650 degrees centigrade; (5) a silane flow rate of from about 120 to about 140 standard cubic centimeters per minute (sccm); (6) an oxygen flow rate of from about 250 to about 280 standard cubic centimeters per minute; and (7) an argon sputtering gas flow rate of from about 120 to about 140 standard cubic centimeters per minute (sccm).

Figure 5:
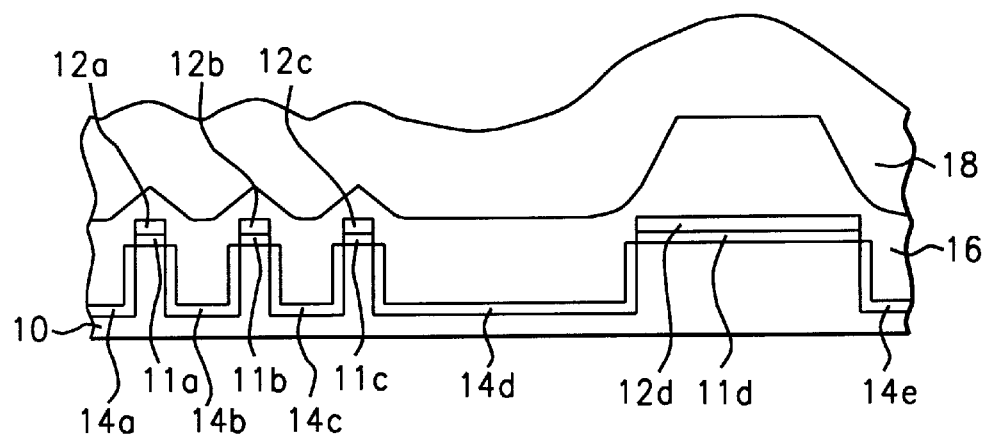

Referring now to FIG. 5, there is shown a schematic cross-sectional diagram illustrating the results of further processing of the integrated circuit microelectronics fabrication whose schematic cross-sectional diagram is illustrated in FIG. 4. Shown in FIG. 5 is a schematic cross-sectional diagram of an integrated circuit microelectronics fabrication otherwise equivalent to the integrated circuit microelectronics fabrication whose schematic cross-sectional diagram illustrated in FIG. 4, but wherein there is formed upon the blanket first trench fill dielectric layer 16 a blanket second trench fill dielectric layer 18. Within the preferred embodiment of the present invention, the blanket second trench fill dielectric layer 18 is formed employing a subatmospheric pressure thermal chemical vapor deposition (SACVD) method employing ozone as an oxidant source material and tetraethylorthosilicate (TEOS) as a silicon source material. Similarly with the blanket first trench fill dielectric layer 16, although the blanket second trench fill dielectric layer 18 may also be formed of dielectric materials including but not limited to silicon oxide dielectric materials, silicon nitride dielectric materials and silicon oxynitride dielectric materials, the blanket second trench fill dielectric layer 18 is preferably formed employing a silicon oxide dielectric material.

Preferably, the subatmospheric pressure thermal chemical vapor deposition (SACVD) method also employs: (1) a reactor chamber of from about 50 to about 70 torr, without plasma activation; (2) a substrate temperature of from about 400 to about 600 degrees centigrade; (3) a tetraethylorthosilicate (TEOS) concentration of from about 400 to about 550 milligrams per cubic meter (mgm) in a helium carrier gas flow of from about 3000 to about 5000 standard cubic centimeters per minute (sccm); (4) an ozone concentration of from about 10 to about 15 percent in an oxygen flow of from about 4500 to about 5500 standard cubic centimeters per minute (sccm); and (5) an ozone:TEOS molar ratio of from about 2:1 to about 5:1.

As is illustrated within the schematic cross-sectional diagram of FIG. 5, the blanket second trench fill dielectric layer 18 formed employing the sub atmospheric pressure thermal chemical vapor deposition (SACVD) method exhibits somewhat of a planarizing effect with respect to the blanket first trench fill dielectric layer 16. For comparison purposes, under circumstances where the blanket second trench fill dielectric layer 18 is alternatively formed employing a lower pressure chemical vapor deposition (CVD) method, the blanket second trench fill layer 18 will typically be formed more conformally upon the blanket first trench fill dielectric layer 16.

Within the method of the present invention and the preferred embodiment of the present invention, the deposition conditions, and more particularly the thicknesses, with which are formed the blanket first trench fill dielectric layer 16 and the blanket second trench fill dielectric layer 18 are selected such that when the blanket second trench fill dielectric layer 18 and the blanket first trench fill dielectric layer 16 are subsequently planarized employing a chemical mechanical polish (CMP) planarizing method, there is attenuated surface erosion of the substrate, or more particularly erosion of the patterned silicon nitride layers 12a, 12b and 12c, the patterned pad oxide layers 11a, 11b and 11c and the semiconductor substrate 10 at the location of the narrow mesas. While not wishing to be bound to a particular theory of operation of the present invention, it is believed that the blanket second trench fill dielectric layer 18 may be formed to provide sufficient thickness over the narrow mesas to attenuate chemical mechanical polish (CMP) induced erosion of the narrow mesas or patterned layers formed upon or over the narrow mesas, while similarly forming the blanket first trench fill dielectric layer 16 to a sufficiently limited thickness such that plasma induced damage incident to forming the blanket first trench fill dielectric layer 16 contributes minimally to such erosion. Similarly, since high density plasma chemical vapor deposition (HDP-CVD) methods are generally recognized as forming dielectric layers with enhanced compressive stress while subatmospheric pressure thermal chemical vapor deposition (SACVD) methods are generally recognized as forming dielectric layers with enhanced tensile stress, the overall physical stress of trench fill dielectric layers formed employing the preferred embodiment of the present invention is also expected to be reduced.

Within the preferred embodiment of the present invention where the depth H of each of the narrow trenches and the wide trench is preferably from about 4000 to about 6000 angstroms, the blanket first trench fill dielectric layer 16 is preferably formed to a thickness of from about 2000 to about 3000 angstroms, while the blanket second trench fill dielectric layer 18 is preferably formed to a thickness of from about 2000 to about 4000 angstroms. Although as illustrated within the schematic cross-sectional diagrams of FIG. 4 and FIG. 5 the blanket first trench fill dielectric layer 16 is formed approximately filling the pair of narrow trenches and the wide trench, as noted above, within the method of the present invention a blanket first trench fill layer, such as the blanket first trench fill dielectric layer 16, need only at least partially fill a trench, such as a trench within the pair of narrow trenches, or the wide trench.

Figure 6:
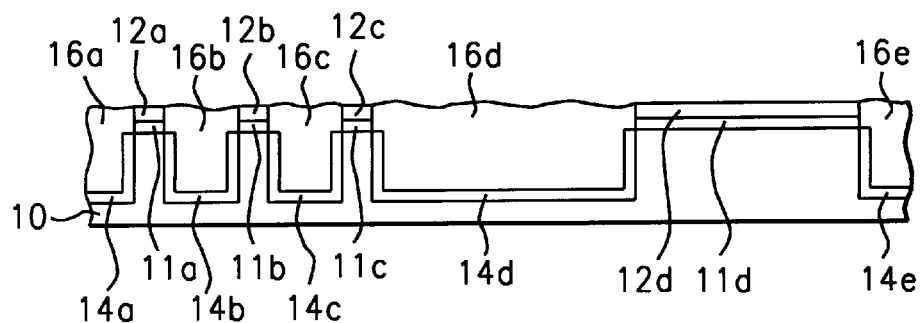

Referring now to FIG. 6, there is shown a schematic cross-sectional diagram illustrating the results of further processing of the integrated circuit microelectronics fabrication whose schematic cross-sectional diagram is illustrated in FIG. 5. Shown in FIG. 6 is a schematic cross-sectional diagram of an integrated circuit microelectronics fabrication otherwise equivalent to the integrated circuit microelectronics fabrication whose schematic cross-sectional diagram is illustrated in FIG. 5, but wherein the blanket second trench fill dielectric layer 18 and the blanket first trench fill dielectric layer 16 have been planarized to form the patterned planarized first trench fill dielectric layers 16a, 16b, 16c, 16d and 16e which serve as a series of isolation regions within a series of trenches which includes the pair of narrow trenches and the wide trench. As is illustrated within the schematic cross-sectional diagram of FIG. 6, the patterned planarized first trench fill dielectric layers 16a, 16b, 16c, 16d and 16e are formed without erosion of any portions of the patterned silicon nitride layers 12a, 12b, 12c or 12d, the patterned pad oxide layers 11a, 11b, 11c or 11d or the semiconductor substrate 10 at the location of any of the narrow mesas or the wide mesa.

As is understood by a person skilled in the art, the preferred embodiment of the present invention is illustrative of the present invention rather than limiting of the present invention. Revisions and modifications may be made to methods, materials, structures and dimensions through which may be formed a microelectronics fabrication in accord with the preferred embodiment of the present invention while still forming a microelectronics fabrication in accord with the present invention, as defined by the appended claims.

What is claimed is:

1. A method for forming a planarized trench fill layer within a trench within a substrate comprising:

providing a substrate having a trench formed therein;

forming over the substrate and at least partially filling the trench a blanket first trench fill layer formed employing a high density plasma chemical vapor deposition (HDP-CVD) method;

forming upon the blanket first trench fill layer a blanket second trench fill layer formed employing a subatmospheric pressure thermal chemical vapor deposition (SACVD) method employing ozone as an oxidant source material and tetraethylorthosilicate (TEOS) as a silicon source material; and planarizing while employing a chemical mechanical polish (CMP) planarizing method the blanket second trench fill layer and the blanket first trench fill layer to form a patterned planarized trench fill layer within the trench.

2. The method of claim 1 wherein the blanket first trench fill layer is formed to a first thickness and the blanket second trench fill layer is formed to a second thickness, where the first thickness and the second thickness are chosen such that there is attenuated erosion of the substrate when forming the patterned planarized trench fill layer within the trench while employing the chemical mechanical polish (CMP) planarizing method.

3. The method of claim 1 wherein the substrate is employed within a microelectronics fabrication selected from the group consisting of semiconductor integrated circuit microelectronics fabrications, solar cell microelectronics fabrications, ceramic substrate microelectronics fabrications and flat panel display microelectronics fabrications.

4. The method of claim 1 wherein the blanket first trench fill layer is formed of a trench fill material selected from the group consisting of trench fill conductor materials, trench fill semiconductor materials and trench fill dielectric materials.

5. A method for forming a planarized trench fill dielectric layer within an isolation trench within a semiconductor substrate comprising:

providing a semiconductor substrate having an isolation trench formed therein;

forming over the semiconductor substrate and at least partially filling the isolation trench a blanket first trench fill dielectric layer formed employing a high density plasma chemical vapor deposition (HDP-CVD) method;

forming upon the blanket first trench fill dielectric layer a blanket second trench fill dielectric layer formed employing a subatmospheric pressure thermal chemical vapor deposition (SACVD) method employing ozone as an oxidant source material and tetraethylorthosilicate (TEOS) as a silicon source material; and planarizing while employing a chemical mechanical polish (CMP) planarizing method the blanket second trench fill dielectric layer and the blanket first trench fill dielectric layer to form a patterned planarized trench fill dielectric layer within the isolation trench.

6. The method of claim 5 wherein the blanket first trench fill dielectric layer is formed to a first thickness and the blanket second trench fill dielectric layer is formed to a second thickness, where the first thickness and the second thickness are chosen such that there is attenuated erosion of the semiconductor substrate when forming the patterned planarized trench fill dielectric layer within the isolation trench while employing the chemical mechanical polish (CMP) planarizing method.

* * * * *